(12) United States Patent
Harasawa et al.

(10) Patent No.: US 9,735,190 B2
(45) Date of Patent: Aug. 15, 2017

(54) SOLID-STATE IMAGING DEVICE, MANUFACTURING METHOD THEREOF, AND ELECTRONIC APPARATUS

(71) Applicant: Sony Corporation, Tokyo (JP)

(72) Inventors: Masanori Harasawa, Kumamoto (JP); Yuichi Seki, Kumamoto (JP); Yukihiro Sayama, Kumamoto (JP)

(73) Assignee: Sony Corporation, Tokyo (JP)

( * ) Notice: Subject to any disclaimer, the term of this patent is extended or adjusted under 35 U.S.C. 154(b) by 136 days.

(21) Appl. No.: 14/501,832

(22) Filed: Sep. 30, 2014

(65) Prior Publication Data

US 2015/0098007 A1   Apr. 9, 2015

(30) Foreign Application Priority Data

Oct. 8, 2013   (JP) .................................. 2013-211188

(51) Int. Cl.
*H01L 27/146*   (2006.01)

(52) U.S. Cl.
CPC .. *H01L 27/14627* (2013.01); *H01L 27/14621* (2013.01); *H01L 27/14623* (2013.01); *H01L 27/14685* (2013.01)

(58) Field of Classification Search
CPC ................ H04N 5/238; H04N 5/23212; H01L 27/14685; H01L 27/14623; H01L 27/14627; H01L 27/14645; H01L 27/14621; H01L 27/14843; H01L 27/14818

USPC ...... 348/342, 69, 294, 432, 70, 72; 257/621, 257/294

See application file for complete search history.

(56) References Cited

U.S. PATENT DOCUMENTS

| | | | | |
|---|---|---|---|---|
| 2006/0102940 | A1* | 5/2006 | Cha ..................... | H01L 27/1462 257/294 |
| 2010/0201855 | A1* | 8/2010 | Wada ................. | H01L 27/14621 348/294 |
| 2011/0096171 | A1* | 4/2011 | Kimura .................... | G02B 7/34 348/187 |
| 2011/0244219 | A1* | 10/2011 | Kubota ..................... | G02B 1/11 428/323 |

FOREIGN PATENT DOCUMENTS

JP           2010-129783 A         6/2010

* cited by examiner

*Primary Examiner* — David Vu
*Assistant Examiner* — Mouloucoulaye Inoussa
(74) *Attorney, Agent, or Firm* — Sheridan Ross P.C.

(57) ABSTRACT

There is provided a solid-state imaging device which includes a plurality of pixels including an imaging pixel for generating a captured image and a focus detection pixel for detecting a focus, in which the focus detection pixel includes a microlens, a photoelectric conversion unit which receives light incident from the microlens, a light-shielding unit which shields a portion of light incident on the photoelectric conversion unit, and a dimming filter which dims the light incident on the photoelectric conversion unit and is formed to contain a black pigment. The present technology can be applied to, for example, a CMOS image sensor.

11 Claims, 10 Drawing Sheets

SOLID-STATE IMAGING DEVICE, MANUFACTURING METHOD THEREOF, AND ELECTRONIC APPARATUS

CROSS REFERENCE TO RELATED APPLICATIONS

This application claims the benefit of Japanese Priority Patent Application JP 2013-211188 filed Oct. 8, 2013, the entire contents of which are incorporated herein by reference.

BACKGROUND

The present technology relates to a solid-state imaging device, a manufacturing method thereof, and an electronic apparatus, and more particularly to a solid-state imaging device which is capable of maintaining accuracy in focus detection to suppress deterioration in an image quality of an image, a manufacturing method thereof, and an electronic apparatus.

As a method of detecting a focus in a solid-state imaging device, a so-called split-pupil type phase difference focus detection method has been used, in which a focus detection pixel generates a pair of image signals corresponding to an image formed by a pair of light beams passing through an optical system and detects a focus based on an amount of deviation of the pair of generated image signals.

However, since an imaging pixel and a focus detection pixel provided in a pixel region have different structures, when exposed to light for the same exposure time, an output of the focus detection pixel may be saturated. Thus, accuracy in focus detection is severely lowered in some cases.

In addition, in the focus detection pixel, it is necessary to form a light-shielding film using a metal and the like on an optical path so as to divide an image signal into two; however, there is a possibility that a color mixture caused by reflection of incident light by a light-shielding film and leakage of the incident light to adjacent imaging pixels lowers a color reproducibility.

In contrast, it is proposed that a color separation filter used in the imaging pixel be formed or that a half mirror member be provided in the focus detection pixel (for example, refer to Japanese Unexamined Patent Application Publication No. 2010-129783).

SUMMARY

However, when a color separation filter is formed in the focus detection pixel, there is a possibility that an amount of light necessary for focus detection is reduced to cause lowering of accuracy in focus detection. In addition, when the half mirror member is provided in the focus detection pixel, there is a possibility that ghosting occurs due to irregular reflection of incident light to cause deterioration in an image quality of an image.

It is desirable to maintain accuracy in focus detection and to suppress deterioration in an image quality of an image.

According to an embodiment of the present technology, there is provided a solid-state imaging device, which includes a plurality of pixels including an imaging pixel for generating a captured image, and a focus detection pixel for detecting a focus, in which the focus detection pixel includes a microlens, a photoelectric conversion unit which receives light incident from the microlens, a light-shielding unit which shields a portion of light incident on the photoelectric conversion unit, and a dimming filter which dims the light incident on the photoelectric conversion unit and is formed to contain a black pigment.

In the solid-state imaging device, the black pigment may contain carbon black.

In the solid-state imaging device, the black pigment may contain titanium black.

In the solid-state imaging device, a refractive index of the dimming filter may be approximately 1.5 to 2.0.

In the solid-state imaging device, transmittance of the dimming filter in a wavelength band of visible light may be approximately 5% to 95%.

In the solid-state imaging device, a film thickness of the dimming filter may be approximately 200 nm to 1200 nm.

According to another embodiment of the present technology, there is provided a method of manufacturing a solid-state imaging device which includes a plurality of pixels including an imaging pixel for generating a captured image and a focus detection pixel for detecting a focus, and in which the focus detection pixel includes a microlens, a photoelectric conversion unit which receives light incident from the microlens, a light-shielding unit which shields a portion of light incident on the photoelectric conversion unit, and a dimming filter which dims the light incident on the photoelectric conversion unit, and the method includes forming the dimming filter with a resin containing a black pigment.

According to still another embodiment of the present technology, there is provided an electronic apparatus including a solid-state imaging device which includes a plurality of pixels including an imaging pixel for generating a captured image and a focus detection pixel for detecting a focus, in which the focus detection pixel includes a microlens, a photoelectric conversion unit which receives light incident from the microlens, a light-shielding unit which shields a portion of light incident on the photoelectric conversion unit, and a dimming filter which dims the light incident on the photoelectric conversion unit and is formed to contain a black pigment.

In the embodiments of the present technology, the focus detection pixel includes the microlens, the photoelectric conversion unit which receives light incident from the microlens, the light-shielding unit which shields a portion of light incident on the photoelectric conversion unit, and the dimming filter which dims the light incident on the photoelectric conversion unit and is formed of a resin containing a black pigment.

According to the embodiments of the present technology, it is possible to maintain accuracy in focus detection and to suppress deterioration in an image quality of an image.

DETAILED DESCRIPTION OF EMBODIMENTS

Figure 1:
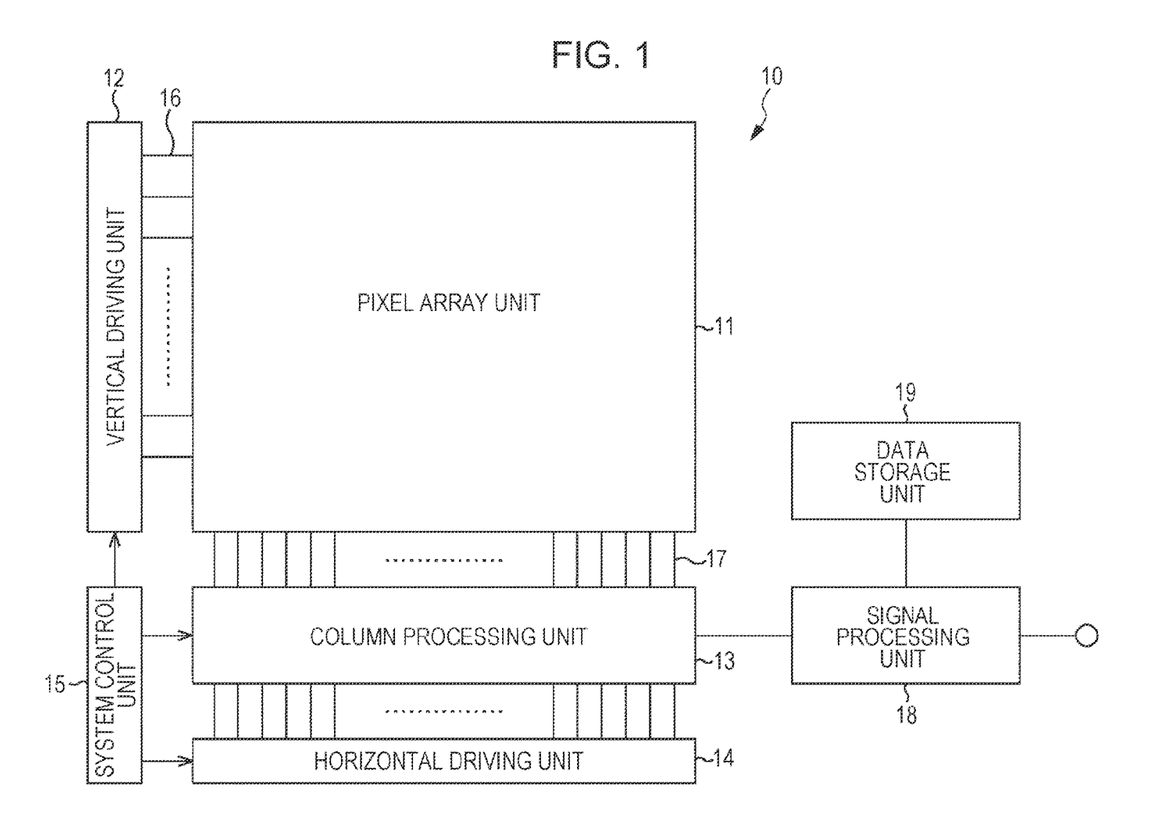
FIG. 1 is a block diagram which shows a configuration example of a solid-state imaging device to which the present technology is applied.

Hereinafter, embodiments of the present technology will be described referring to drawings.
Configuration Examples of a Solid-State Imaging Device FIG. 1 is a block diagram which shows an embodiment of a solid-state imaging device to which the present technology is applied. The following description is for a configuration of a Complementary Metal Oxide Semiconductor (CMOS) image sensor of a surface irradiation type which is one of amplification type solid-state imaging devices. The present technology can be applied to not only the CMOS image sensor of a surface irradiation type, but also a CMOS image sensor of a back surface irradiation type or a solid-state imaging device of a charge transfer type such as other amplification type solid state imaging devices, a Charge Coupled Device (CCD) image sensor, and the like.

The CMOS image sensor 10 shown in FIG. 1 is configured to have a pixel array unit 11 formed on a semiconductor substrate which is not shown, and peripheral circuit portions integrated on the same semiconductor substrate as the pixel array unit 11. The peripheral circuit portions are configured to have, for example, a vertical driving unit 12, a column processing unit 13, a horizontal driving unit 14, and a system control unit 15.

Furthermore, the CMOS image sensor 10 includes a signal processing unit 18 and a data storage unit 19.

A pixel array unit 11 adopts a configuration in which a unit pixel (hereinafter, simply referred to as a pixel) which has a photoelectric conversion unit that generates photoelectric charges according to an amount of received light and accumulates the photoelectric charges is two-dimensionally disposed in a row direction and a column direction, that is, in a matrix form. Here, the row direction represents an array direction (horizontal direction) of pixels in a pixel row, and the column direction represents an array direction (vertical direction) of pixels in a pixel column. A plurality of pixels, which includes a pixel (imaging pixel) which generates a signal for generating a captured image based on received subject light and a pixel (focus detection pixel) which generates a signal for detecting a focus, are disposed in the pixel array unit 11.

In the pixel array unit 11, a pixel array in a matrix form is provided, in which a pixel driving line 16 is wired along the row direction for each pixel row, and a vertical signal line 17 is wired along the column direction for each pixel column. The pixel driving line 16 transfers a driving signal for performing a drive when reading out a signal from a pixel. In FIG. 1, the pixel driving line 16 is shown as one wiring; however, this is not limited to one. One end of the pixel driving line 16 is connected to an output end of the vertical driving unit 12 corresponding to each row.

The vertical driving unit 12 is configured to have a shift register, an address decoder, or the like, and drives each pixel of the pixel array unit 11 all at the same time or on a row-by-row basis. That is, the vertical driving unit 12 configures both a system control unit 15 which controls the vertical driving unit 12, and a driving unit which drives each pixel of the pixel array unit 11. A specific configuration of the vertical driving unit 12 is not illustrated; however, the vertical driving unit 12 is generally configured to have two scanning systems which are a readout scanning system and a sweep scanning system.

The readout scanning system sequentially performs selective scanning on a unit pixel of the pixel array unit 11 on a row-by-row basis so as to read out a signal from the unit pixel. The signal which is readout from the unit pixel is an analog signal. With respect to a reading row which is readout and scanned by the readout scanning system, the sweep scanning system sweeps and scans earlier than the reading out and scanning by the time of shutter speed.

Sweeping and scanning by the sweep scanning system sweeps unnecessary charges from a photoelectric conversion unit of a unit pixel in a reading row, and thereby the photoelectric conversion unit is reset. Then, the sweep scanning system sweeps (resets) unnecessary charges, and thereby an electronic shutter operation is performed. Here, the electronic shutter operation refers to an operation of discarding light electric charges of the photoelectric conversion unit and newly starting light exposure (starting to accumulate light electric charges).

A signal which is readout in the readout operation by the readout scanning system corresponds to an amount of light received after an immediately preceding readout operation or the electronic shutter operation. Then, a period from read timing by the immediately preceding readout operation or sweep timing by the electronic shutter operation to readout timing by a readout operation of this time is a light exposure period of the light electric charges in a unit pixel.

A signal which is output from each unit pixel in a pixel row selectively scanned by the vertical driving unit 12 is input to the column processing unit 13 through each vertical signal line 17 for each pixel column. For each pixel column of the pixel array unit 11, the column processing unit 13 performs predetermined signal processing on the signal output from each pixel in a selected row through the vertical signal line 17 and temporarily holds a pixel signal after the signal processing.

Specifically, the column processing unit 13 performs at least noise removing processing, for example, Correlated Double Sampling (CDS) processing, as signal processing. The column processing unit 13 performs CDS processing, and thereby fixed pattern noises of a pixel's own such as reset noises or variation in a threshold value of an amplification transistor in a pixel and the like are removed. In addition to the noise removing processing, the column processing unit 13 has, for example, a function of converting Analog-to-Digital (AD), so that an analog pixel signal can be converted into a digital signal to be output.

The horizontal driving unit 14 is configured to have a shift register, an address decoder, or the like, and sequentially selects a unit circuit corresponding to a pixel column of the column processing unit 13. The horizontal driving unit 14 performs selective scanning, and thereby a pixel signal which is processed for each unit circuit is sequentially output in the column processing unit 13.

The system control unit 15 is configured to have a timing generator which generates various types of timing signals and the like, and performs a driving control on the vertical driving unit 12, the column processing unit 13, the horizontal driving unit 14, and the like based on various types of timing signals generated by the timing generator.

The signal processing unit 18 has at least an operation processing function, and performs various types of signal processing such as operation processing and the like on a pixel signal output from the column processing unit 13. The data storage unit 19 temporarily stores data necessary for signal processing by the signal processing unit 18.

The signal processing unit 18 and the data storage unit 19 may be mounted on a substrate (semiconductor substrate) the same as that of the CMOS image sensor 10, or may be disposed on a substrate different from that of the CMOS image sensor 10. In addition, each processing of the signal processing unit 18 and the data storage unit 19 may be performed by an external signal processing unit which is provided on a substrate different from that of the CMOS image sensor 10, for example, a Digital Signal Processor (DSP) circuit or software.

Pixel Array of a Pixel Array Unit

Next, a pixel disposition of the pixel array unit 11 will be described referring to FIG. 2.

Figure 2:
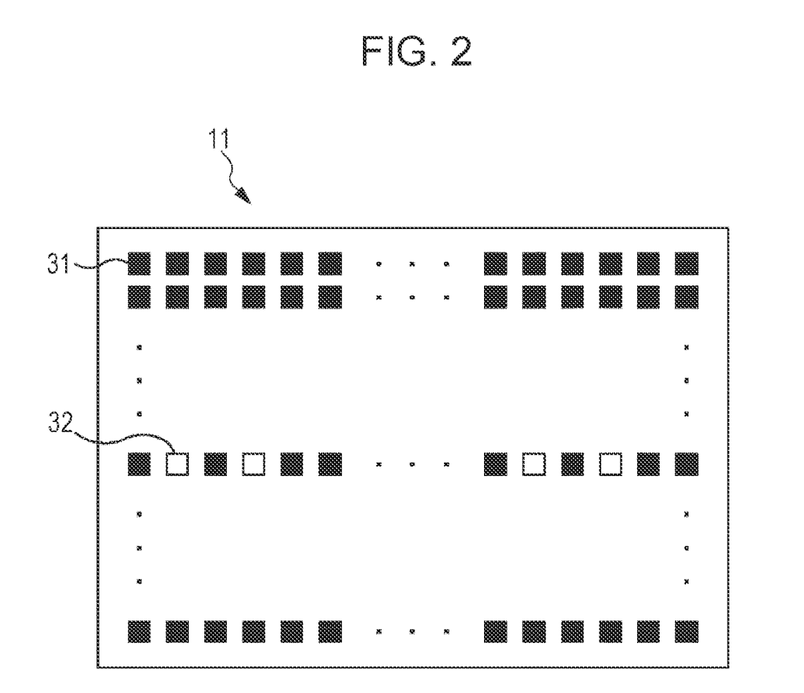
FIG. 2 is a view which describes a pixel disposition of a pixel array unit.

As shown in FIG. 2, a plurality of imaging pixels 31 shown by black squares are two-dimensionally disposed in a matrix form in the pixel array unit 11. The imaging pixel 31 is made of an R pixel, a G pixel, and a B pixel, and these are regularly disposed according to a Bayer array.

Moreover, a plurality of focus detection pixels 32 which are shown by white squares are scattered and disposed among the plurality of imaging pixels 31 two-dimensionally disposed in a matrix form in the pixel array unit 11. Specifically, the focus detection pixels 32 are regularly disposed in a specific pattern by replacing some of the imaging pixels 31 in one predetermined row among pixel rows in the pixel array unit 11. Disposition of the imaging pixels 31 and the focus detection pixels 32 in the pixel array unit 11 is not limited to the above, but may be performed in other patterns.

Next, a detailed configuration of the imaging pixel 31 and the focus detection pixel 32 in the pixel array unit 11 will be described.

<Configuration Example of a Pixel in an Image Sensor>

Figure 3:
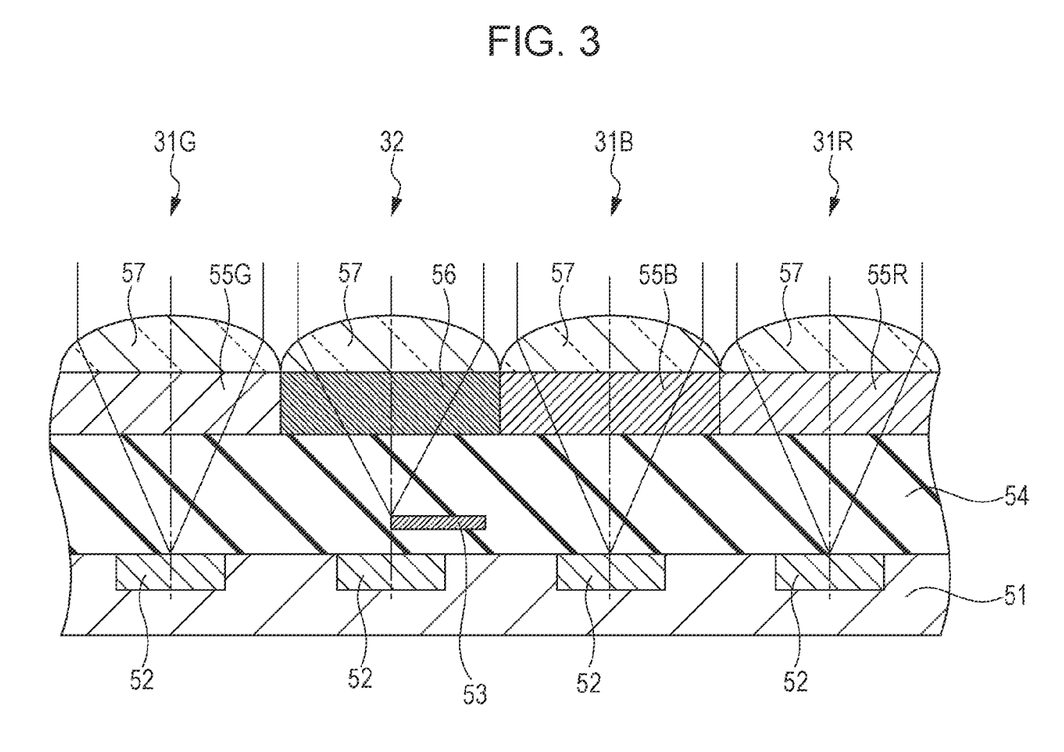
FIG. 3 is a cross-sectional view which shows a configuration example of an imaging pixel and a focus detection pixel of the present technology.

FIG. 3 is a cross-sectional view which shows a configuration example of a pixel in the CMOS image sensor 10. FIG. 3 shows a cross-sectional view of imaging pixels 31R, 31G, 31B, and the focus detection pixel 32 in the CMOS image sensor 10.

As shown in FIG. 3, in the imaging pixels 31R, 31G, and 31B, the photoelectric conversion unit 52 which receives incident light and performs photoelectric conversion is formed in the semiconductor substrate 51. An insulating layer 54 is formed at an upper layer of the semiconductor substrate 51, and color filters 55R, 55G, and 55B which have spectral characteristics corresponding to each of the imaging pixels 31R, 31G, and 31B are formed on the insulating layer 54. Then, a microlens 57 is formed on each of the color filters 55R, 55G, and 55B. When the CMOS image sensor 10 is a CMOS image sensor of a surface irradiation type, a wiring layer made of Cu or Al is formed in the insulating layer 54.

Meanwhile, the semiconductor substrate 51, the photoelectric conversion unit 52, the insulating layer 54, and the microlens 57 are formed in the focus detection pixel 32 in the same manner as in the imaging pixel 31. However, a light-shielding film 53 is formed in the insulating layer 54, and a dimming filter 56 for dimming an amount of incident light is formed on the insulating layer 54. A portion of the wiring layer formed in the insulating layer 54 may be formed as the light-shielding film 53.

In the focus detection pixel 32, a light-receiving region of the photoelectric conversion unit 52 is prescribed by the light-shielding film 53, and the light-shielding film 53 is disposed so as to shield substantially a half of subject light incident on the light-receiving region of the photoelectric conversion unit 52. Accordingly, the photoelectric conversion unit 52 receives substantially a half of subject light incident from the microlens 57, and thereby an image surface is divided in the focus detection pixel 32.

In addition, the dimming filter 56 is formed by a resin containing a black pigment. Specifically, black pigment particles such as carbon black, titanium black, or the like are contained in an acrylic-based, a styrene-based, and a silane-based copolymer resin, and thereby the dimming filter 56 is formed. This black pigment functions as a light absorbing material, and distribution of the black pigment and the resin is adjusted, and thereby the refractive index and the transmittance of the dimming filter 56 are determined. For example, the refractive index of the dimming filter 56 is approximately 1.5 to 2.0, and the transmittance in a wavelength band of visible light is approximately 5% to 95%.

The dimming filter 56 may be formed to contain other known black pigments or black dyes, without being limited to carbon black or titanium black. In particular, from a viewpoint that a high optical density can be realized with a small amount, for example, the dimming filter 56 may be formed to contain iron oxide, manganese oxide, graphite, or the like.

Furthermore, in a formation of the dimming filter 56, these black pigments or black dyes may be used in combination. For example, carbon black and titanium black may be used in combination, and other black pigments or black dyes may be used in combination in addition to carbon black and titanium black.

In the CMOS image sensor 10 including the imaging pixel 31 and the focus detection pixel 32 as described above, it is necessary to focus on a light-receiving surface of the photoelectric conversion unit 52 in the imaging pixel 31, and to focus on the light-shielding film 53 in the focus detection pixel 32.

Figure 4:
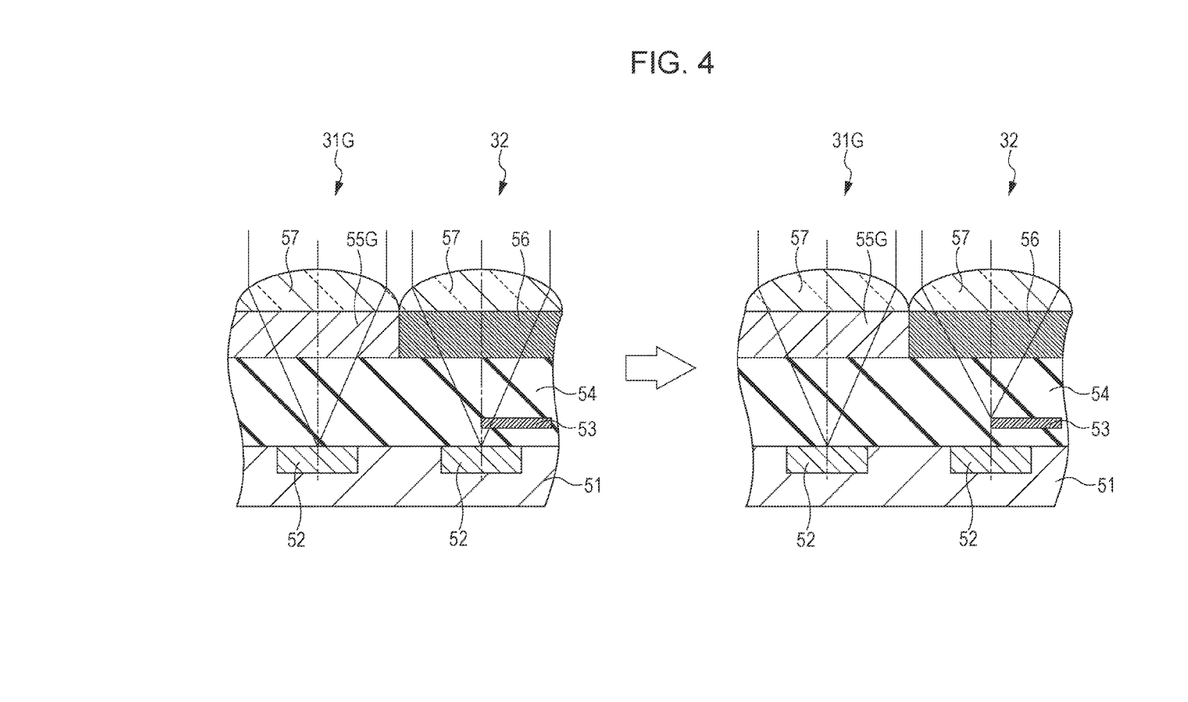
FIG. 4 is a view which describes an advantage in the focus detection pixel of the present technology.

Here, as shown on a left side of FIG. 4, in each of the imaging pixel 31G and the focus detection pixel 32, even if the light-receiving surface of the photoelectric conversion unit 52 is focused on, a refractive index of the dimming filter 56 is made to be greater than a refractive index of the microlens 57, and thereby it is possible to focus on the light-shielding film 53 in the focus detection pixel 32 as shown on a right side of FIG. 4. Accordingly, it is possible to maintain accuracy in focus detection by the focus detection pixel 32 without impairing sensitivity of the imaging pixel 31G.

Figure 5:
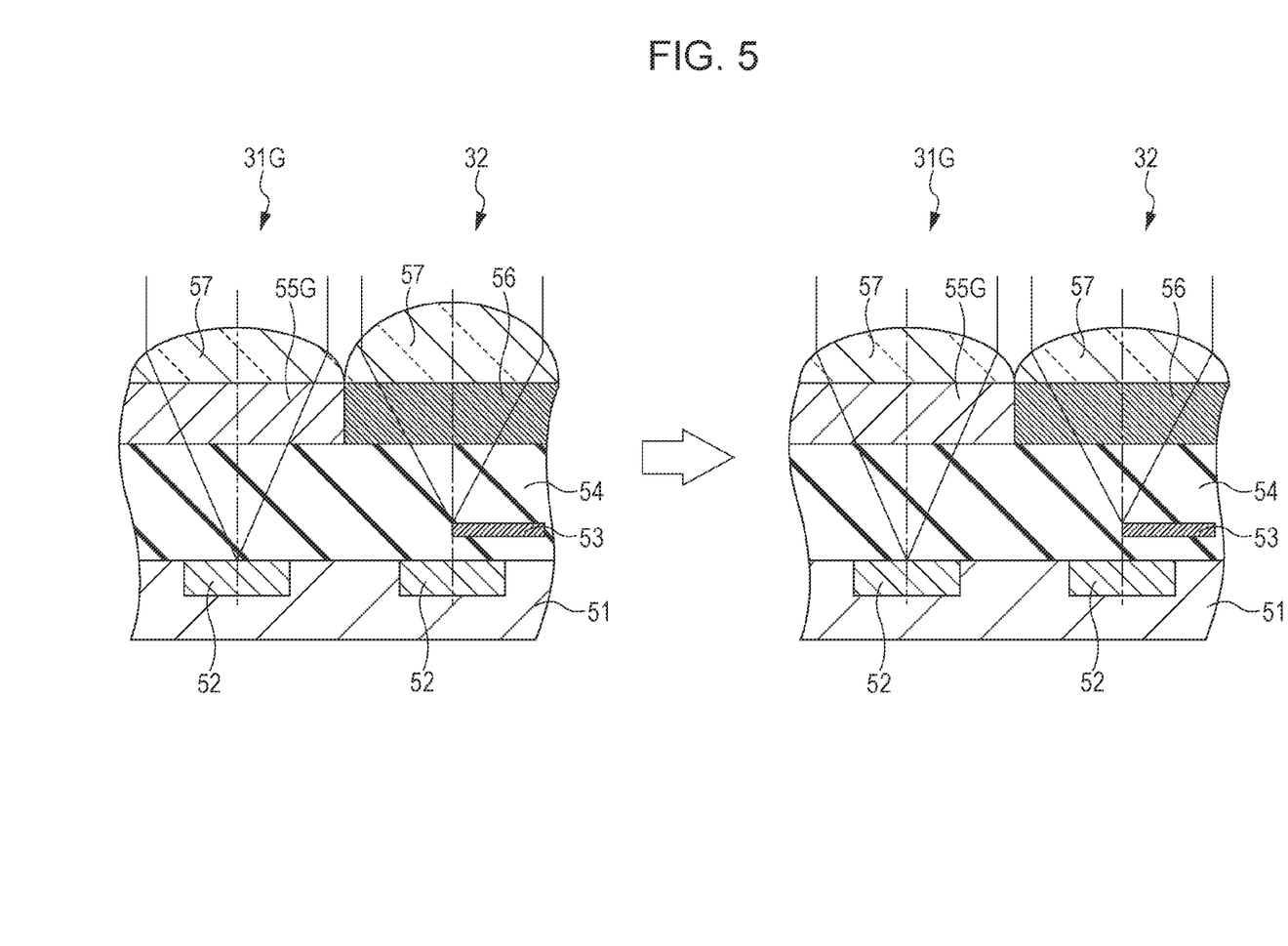
FIG. 5 is a view which describes an advantage in the focus detection pixel of the present technology.

In the related art, in order to focus on the light-receiving surface of the photoelectric conversion unit 52 in the imaging pixel 31 and to focus on the light-shielding film 53 in the focus detection pixel 32, as shown on the left side of FIG. 5, the microlens 57 is made and divided in the imaging pixel 31 and the focus detection pixel 32. However, in this case, not only does a manufacturing process become complicated, but also it is necessary to strictly control positional deviation of the microlens 57.

In contrast, in the focus detection pixel 32 of an embodiment of the present technology, a refractive index of the dimming filter 56 is appropriately determined, and thereby it is possible to focus on the light-shielding film 53 in the focus detection pixel 32 without making and dividing the microlens 57 as shown on the right side of FIG. 5. That is, it is possible to maintain accuracy in focus detection in the focus detection pixel 32 without impairing sensitivity of the imaging pixel 31G by a process having high robustness.

In a pixel disposed at a position spaced away from a center of the pixel array unit (pixel region) of a related art, so-called pupil correction which shifts a position of the microlens according to a deviation of an optical axis of light incident on the pixel is performed. However, with only the pupil correction, it is not possible to correct the deviation of an optical axis of incident light, and light is not incident on the photoelectric conversion unit 52 of the focus detection pixel 32 in some cases, as shown on a left side of FIG. 6.

Figure 6:
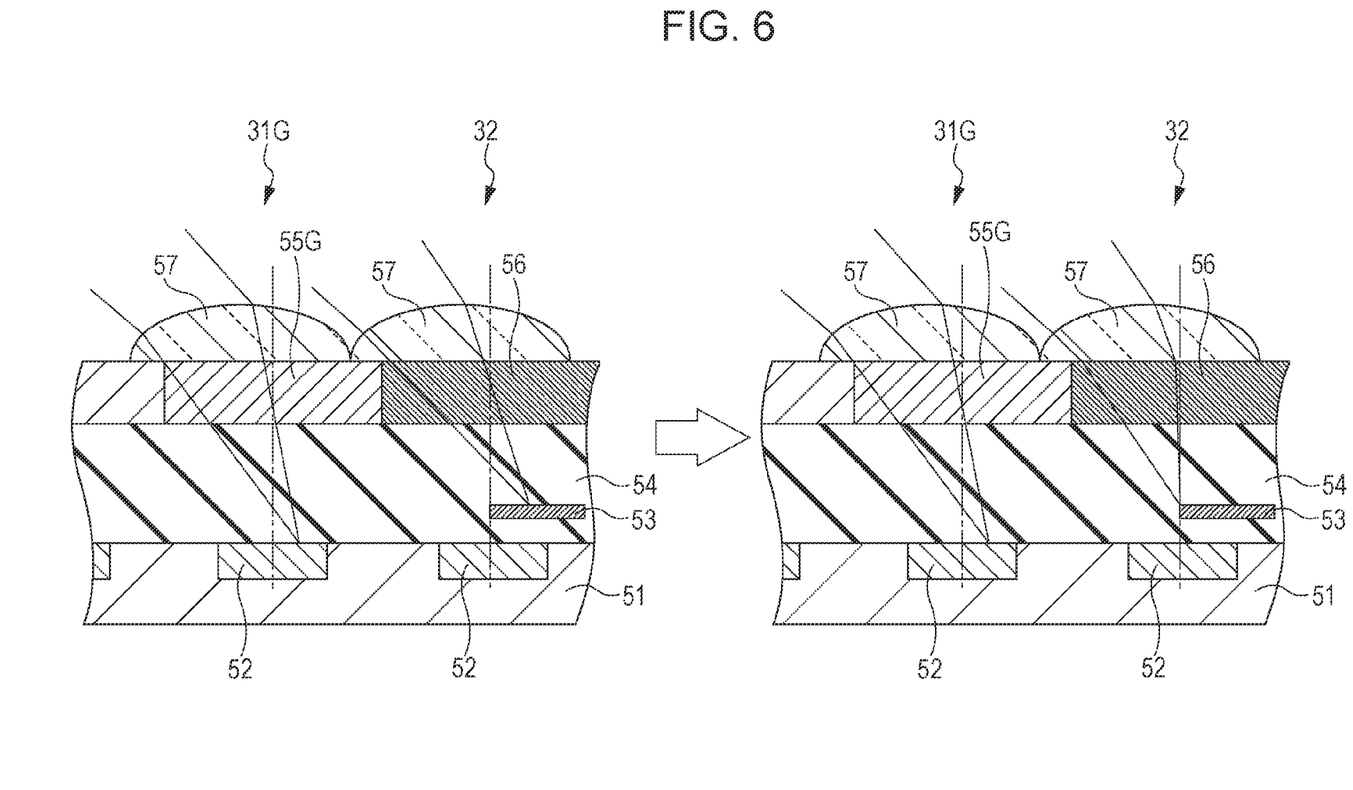
FIG. 6 is a view which describes an advantage in the focus detection pixel of the present technology.

In contrast, a refractive index of the dimming filter 56 is appropriately determined in the focus detection pixel 32 of an embodiment of the present technology, and thereby it is possible to allow light to be incident on the photoelectric conversion unit 52 of the focus detection pixel 32 by correcting deviation of an optical axis of the incident light as shown on the right side of FIG. 6.

Figure 7:
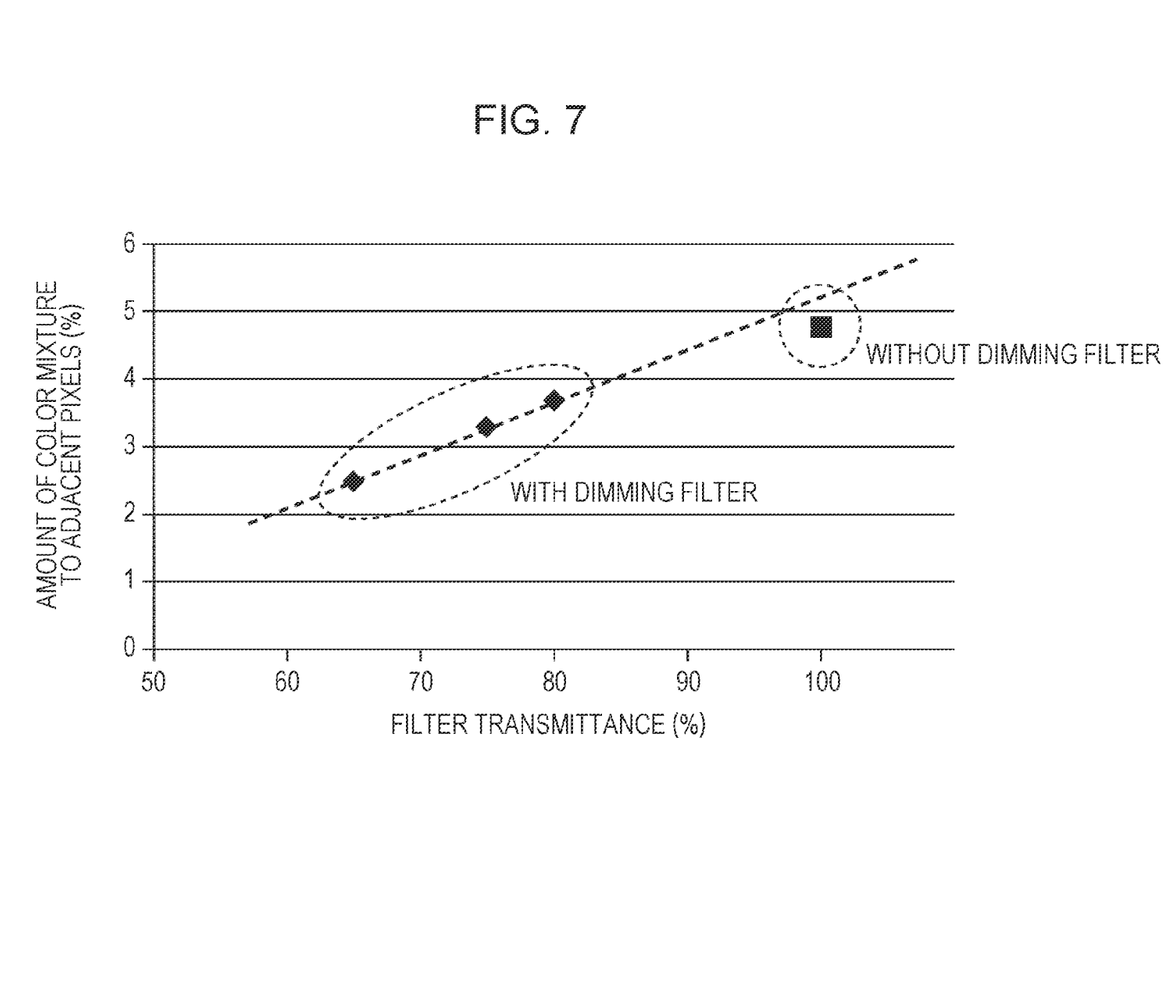
FIG. 7 is a view which shows a relationship between transmittance of a dimming filter and an amount of color mixture with adjacent pixels.

Furthermore, the applicant confirms that color mixture to the imaging pixel 31 (adjacent pixel) which is adjacent to the focus detection pixel 32 is suppressed by lowering the transmittance of the dimming filter 56 as shown in FIG. 7. Specifically, an amount of color mixture to adjacent pixels (a ratio of an amount of color-mixed light to an amount of incident light) is about 4.8% when the transmittance of the dimming filter 56 is 100% (when the dimming filter 56 is not provided), is about 3.7% when the transmittance of the dimming filter 56 is 80%, is about 3.3% when the transmittance of the dimming filter 56 is 75%, and is about 2.5% when the transmittance of the dimming filter 56 is 65%.

As described above, in the focus detection pixel 32 of an embodiment of the present technology, the transmittance of the dimming filter 56 is appropriately determined, and thereby color mixture between adjacent pixels is suppressed. Therefore, deterioration in color reproducibility can be suppressed. In addition, in this case, since an amount of light incident on the focus detection pixel 32 is also reduced, it is possible to prevent an output of the focus detection pixel 32 from being saturated.

Furthermore, since a black pigment contained in the dimming filter 56 functions as a light absorbing material, irregular reflection of the incident light can be reduced, and occurrence of ghosting can be suppressed.

As described above, since the refractive index and the transmittance are approximately determined by adjusting distribution of a black pigment and a resin in a dimming filter of the focus detection pixel by a design, it is possible to maintain accuracy in focus detection of the focus detection pixel without impairing sensitivity of the imaging pixel, and to suppress color mixture to adjacent pixels or occurrence of ghosting. Thus, it is possible to suppress deterioration in an image quality of an image.

A Flow of Pixel Formation

Figure 8:
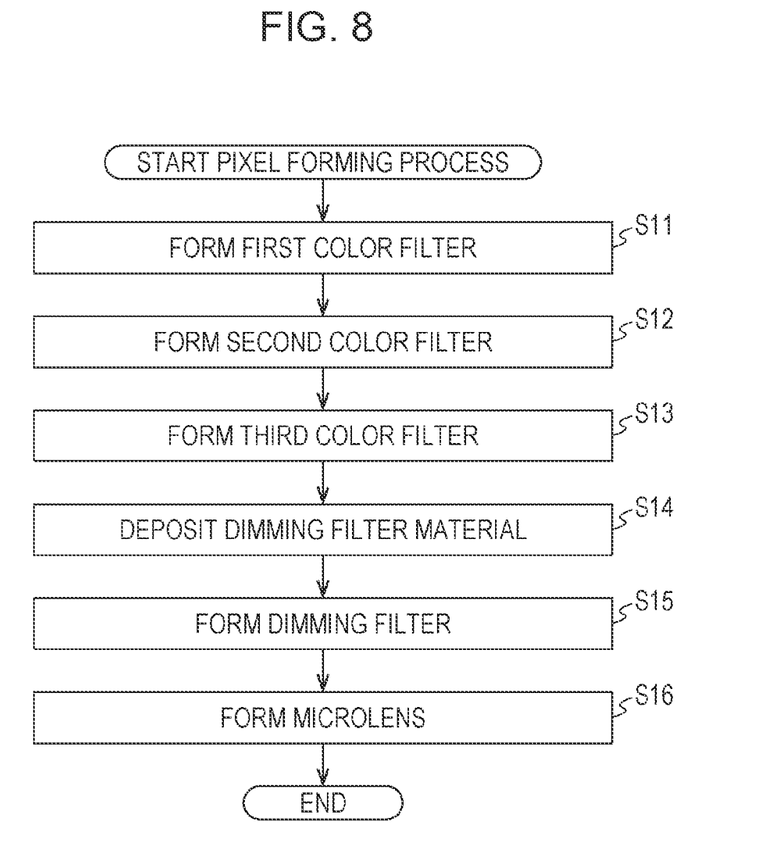
FIG. 8 is a flowchart which describes pixel forming processing.

Next, a flow of pixel formation of the CMOS image sensor 10 of the present technology will be described referring to FIGS. 8 and 9A to 9F. FIG. 8 is a flowchart which describes pixel formation processing, and FIGS. 9A to 9F are cross-sectional views which show a process of pixel formation.

Hereinafter, processing after forming the insulating layer 54 will be described.

Figure 9A:
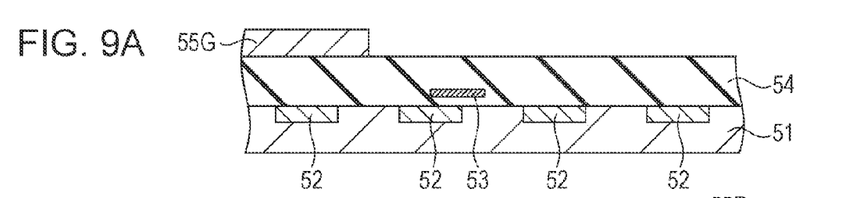
FIGS. 9A to 9F are views which describe a process of pixel formation.

First, in step S11, a first color filter is formed. Specifically, as shown in FIG. 9A, a green color filter 55G is formed in a region corresponding to the imaging pixel 31G on the insulating layer 54.

Figure 9B:
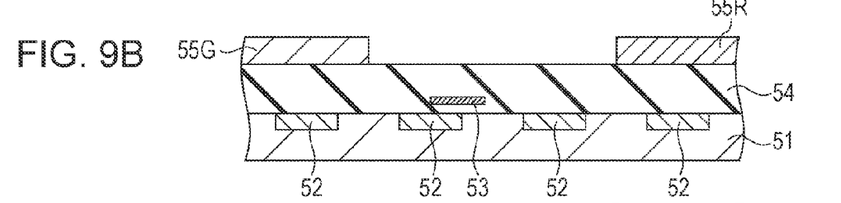

Next, in step S12, a second color filter is formed. As shown in FIG. 9B, a red color filter 55R is formed in a region corresponding to the imaging pixel 31R on the insulating layer 54.

Figure 9C:
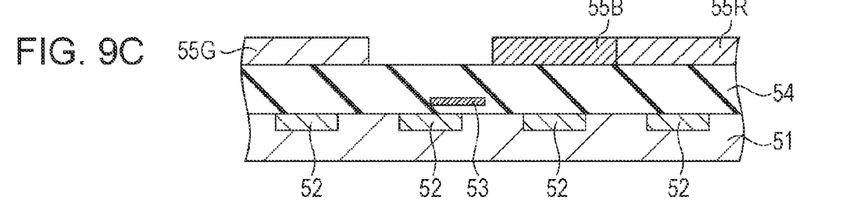

Furthermore, in step S13, a third color filter is formed. Specifically, as shown in FIG. 9C, a blue color filter 55B is formed in a region corresponding to the imaging pixel 31B on the insulating layer 54.

Formation of these color filters is performed by photolithography using a photosensitive resin colored in each color. The formation of color filters may be performed by a method other than the photolithography, or may be performed, for example, by forming a colored film and performing etching thereon.

Figure 9D:
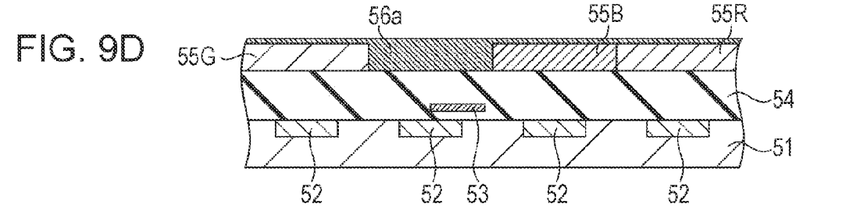

In step S14, as shown in FIG. 9D, a dimming filter material 56a is deposited on the insulating layer 54 on which color filters 55R, 55G, and 55B of each color are formed. Specifically, black pigment particles such as carbon black, titanium black, or the like are contained in an acrylic-based, a styrene-based, and a silane-based copolymer resin, and thereby the dimming filter material 56a having photosensitivity is formed by, for example, a spin coating method. Here, the distribution of a black pigment and resin in the dimming filter material 56a is appropriately adjusted by a design.

Figure 9E:
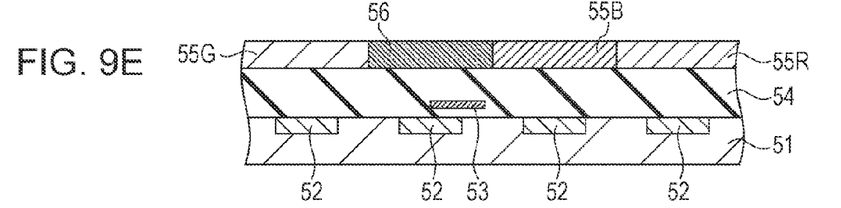

In step S15, the dimming filter 56 is formed by photolithography as shown in FIG. 9E. For example, a film thickness of the dimming filter 56 may be approximately 200 nm to 1200 nm, and may be different from thicknesses of color filters 55R, 55G, and 55B of each color. As described above, the dimming filter material 56a has photosensitivity, thereby being stabilized with high accuracy and forming the dimming filter 56 by photolithography.

Figure 9F:
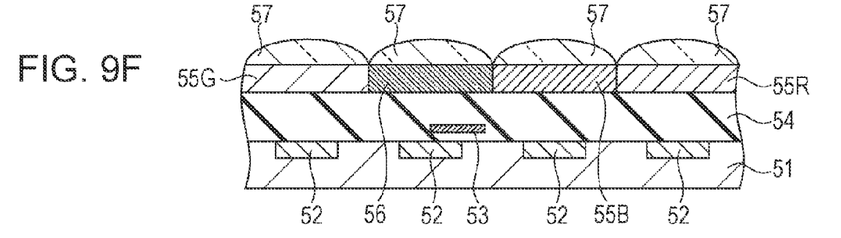

Then, in step S16, the microlens 57 is formed on the color filters 55R, 55G, and 55B of each color and the dimming filter 56.

According to the above processing, since the refractive index and the transmittance are approximately determined by adjusting the distribution of a black pigment and a resin in the dimming filter of the focus detection pixel, it is possible to maintain accuracy in focus detection of the focus detection pixel without impairing sensitivity in the imaging pixel, and to suppress color mixture to adjacent pixels and occurrence of ghosting. Thus, it is possible to suppress deterioration in an image quality of an image.

Moreover, a sequence in which color filters and dimming filters of each color are formed is not limited to a sequence shown in processing described above, but may be changed when necessary.

Configuration Examples of an Electronic Apparatus

Next, a configuration example of an electronic apparatus to which the present technology is applied will be described referring to FIG. 10.

Figure 10:
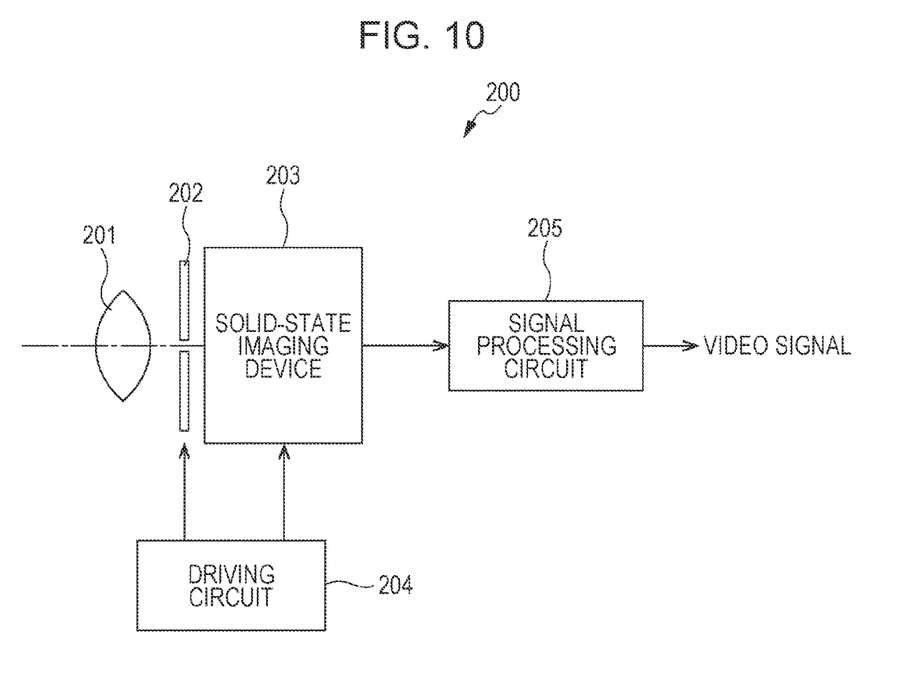
FIG. 10 is a block diagram which shows a configuration example of an electronic apparatus to which the present technology is applied.

An electronic apparatus 200 shown in FIG. 10 includes an optical lens 201, a shutter device 202, a solid-state imaging device 203, a driving circuit 204, and a signal processing circuit 205. FIG. 10 shows an embodiment in which the CMOS image sensor 10 of the present technology described above is provided in an electronic apparatus (digital still camera) as the solid-state imaging device 203.

The optical lens 201 helps image light (incident light) from a subject to be image-formed on an imaging surface of the solid-state imaging device 203. Accordingly, signal charges are accumulated in the solid-state imaging device 203 for a fixed period of time. The shutter device 202 controls a light irradiation period and a light-shielding period for the solid-state imaging device 203.

The driving circuit 204 supplies a driving signal which controls a signal transfer operation of the solid-state imaging device 203 and a shutter operation of the shutter device 202. The solid-state imaging device 203 performs the signal transfer operation using the driving signal (timing signal) supplied from the driving circuit 204. The signal processing circuit 205 performs various types of signal processing on a signal output from the solid-state imaging device 203. A video signal on which signal processing is performed is stored in a storage medium such as a memory and the like, and is output to a monitor.

Furthermore, the electronic apparatus 200 includes a lens driving unit (not shown) which drives the optical lens 201 in an optical axis direction thereof. A lens driving unit configures both the optical lens 201 and a focusing mechanism which adjusts a focus. Then, various controls such as a control of the focusing mechanism, a control of each configuration element described above, and the like are performed by a system controller which is not illustrated in the electronic apparatus 200.

With respect to a control of a focusing mechanism, operation processing which calculates a deviation direction and an amount of deviation of a focus is performed, for example, in the signal processing circuit 205 based on a focus detection signal output from the focus detection pixel in the solid-state imaging device of the present technology. The system controller receives an operation result, and performs a focus control to match a focus by moving the optical lens 201 in an optical axis direction thereof through a lens driving unit.

In the electronic apparatus 200 of an embodiment of the present technology, since it is possible to maintain accuracy in focus detection and to suppress deterioration in an image quality of an image in the solid-state imaging device 203, improvement of image quality is achieved as a result.

Embodiments of the present technology are not limited to the embodiments described above, and various modifications can be made in a range without departing from the scope of the present technology.

Furthermore, the present technology can adopt a configuration as follows.

(1)

A solid-state imaging device includes:

a plurality of pixels including imaging pixel for generating a captured image and a focus detection pixel for detecting a focus, in which the focus detection pixel includes a microlens, a photoelectric conversion unit which receives light incident from the microlens, a light-shielding unit which shields a portion of light incident on the photoelectric conversion unit, and a dimming filter which dims the light incident on the photoelectric conversion unit and is formed to contain a black pigment.

(2)

The solid-state imaging device described in (1), in which the black pigment includes carbon black.

(3)

The solid-state imaging device described in (1), in which the black pigment includes titanium black.

(4)

The solid-state imaging device described in any one of (1) to (3), in which a refractive index of the dimming filter is approximately 1.5 to 2.0.

(5)

The solid-state imaging device described in any one of (1) to (4), in which transmittance of the dimming filter in a wavelength band of visible light is approximately 5% to 95%.

(6)

The solid-state imaging device described in any one of (1) to (5), in which a film thickness of the dimming filter is approximately 200 nm to 1200 nm.

(7)

A method of manufacturing a solid-state imaging device which includes a plurality of pixels including an imaging pixel for generating a captured image and a focus detection pixel for detecting a focus, and in which the focus detection pixel includes a microlens, a photoelectric conversion unit which receives light incident from the microlens, a light-shielding unit which shields a portion of light incident on the photoelectric conversion unit, and a dimming filter which dims the light incident on the photoelectric conversion unit, and the method includes:

forming the dimming filter with a resin containing a black pigment.

(8)

An electronic apparatus includes:

a solid-state imaging device which includes a plurality of pixels including an imaging pixel for generating a captured image and a focus detection pixel for detecting a focus, in which the focus detection pixel includes a microlens, a photoelectric conversion unit which receives light incident from the microlens, a light-shielding unit which shields a portion of light incident on the photoelectric conversion unit, and a dimming filter which dims the light incident on the photoelectric conversion unit and is formed to contain a black pigment.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
a plurality of pixels including an imaging pixel for generating a captured image and a focus detection pixel for detecting a focus, wherein the focus detection pixel includes:
a microlens that receives incident light;
a dimming filter that dims the incident light;
a light-shielding unit that shields a portion of the dimmed incident light; and
a photoelectric conversion unit which receives an unshielded portion of the dimmed incident light from the dimming filter,
wherein the dimming filter includes a black pigment, and
wherein the dimming filter has a refractive index greater than a refractive index of the microlens such that the microlens and the dimming filter cause a focal point of the dimmed incident light to be closer to the light-shielding unit than the photoelectric conversion unit.

2. The solid-state imaging device according to claim 1, wherein the black pigment includes carbon black.

3. The solid-state imaging device according to claim 1, wherein the black pigment includes titanium black.

4. The solid-state imaging device according to claim 1, wherein a refractive index of the dimming filter is approximately 1.5 to 2.0.

5. The solid-state imaging device according to claim 4, wherein transmittance of the dimming filter in a wavelength band of visible light is approximately 5% to 95%.

6. The solid-state imaging device according to claim 5, wherein a film thickness of the dimming filter is approximately 200 nm to 1200 nm.

7. An electronic apparatus comprising:
a solid-state imaging device which includes a plurality of pixels including an imaging pixel for generating a captured image and a focus detection pixel for detecting a focus,
wherein the focus detection pixel includes:
a microlens that receives incident light;
a dimming filter that dims the incident light;
a light-shielding unit that shields a portion of the dimmed incident light; and
a photoelectric conversion unit which receives an unshielded portion of the dimmed incident from the dimming filter,
wherein the dimming filter includes a black pigment, and
wherein the dimming filter has a refractive index greater than a refractive index of the microlens such that the microlens and the dimming filter cause a focal point of the dimmed incident light to be closer to the light-shielding unit than the photoelectric conversion unit.

8. The solid-state imaging device according to claim 1, wherein a focal point of the imaging pixel is at a photoelectric conversion unit of the imaging pixel and the focal point of the dimmed incident light is at the light-shielding unit.

9. The solid-state imaging device according to claim 1, wherein the imaging pixel includes a color filter, and wherein the color filter and the dimming filter are coplanar.

10. The solid-state imaging device according to claim 1, wherein the light-shielding unit shields substantially half of the dimmed incident light.

11. The solid-state imaging device according to claim 1, wherein the focus detection pixel generates a pair of image signals corresponding to an image formed by a pair of light beams passing through the microlens to detect a focus based on an amount of deviation between the pair of image signals.

* * * * *